(12) United States Patent
Das et al.

(10) Patent No.: US 11,303,278 B1
(45) Date of Patent: Apr. 12, 2022

(54) CIRCUITS FOR LEVEL SHIFTING OF VOLTAGE OF DATA IN TRANSMITTING APPARATUS, AND METHODS THEREOF

(71) Applicant: SAMSUNG ELECTRONICS CO., LTD., Suwon-si (KR)

(72) Inventors: Tamal Das, West Bengel (IN); Umamaheswara Reddy Katta, Andhra Pradesh (IN)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/222,349

(22) Filed: Apr. 5, 2021

(30) Foreign Application Priority Data

Dec. 11, 2020 (IN) .............................. 202041053874

(51) Int. Cl.
*H03K 3/00* (2006.01)
*H03K 19/0175* (2006.01)
*H03K 19/0185* (2006.01)
*H03L 5/00* (2006.01)
*H03K 3/356* (2006.01)

(52) U.S. Cl.
CPC ............... *H03K 19/018521* (2013.01); *H03K 3/356113* (2013.01); *H03K 19/01855* (2013.01)

(58) Field of Classification Search
CPC ........... H03K 19/0175; H03K 19/0185; H03K 19/018507; H03K 19/018514; H03K 19/018521; H03K 19/018528
See application file for complete search history.

(56) References Cited

U.S. PATENT DOCUMENTS

| | | | | |
|---|---|---|---|---|
| 6,049,228 A | * | 4/2000 | Moon | ............ H03K 19/018521 326/81 |
| 6,184,718 B1 | | 2/2001 | Tran et al. | |
| 6,259,299 B1 | * | 7/2001 | Ryu | ............... H03K 19/018521 327/333 |
| 7,471,105 B2 | * | 12/2008 | Kim | ................. H03K 19/01721 326/68 |
| 7,812,660 B2 | * | 10/2010 | Tamura | .............. H03K 19/0013 327/333 |

(Continued)

OTHER PUBLICATIONS

Serneels, et al., "A High speed, Low Voltage to High Voltage Level Shifter in Standard 1.2V 0.13μm CMOS", Published in: 2006 13th IEEE International Conference on Electronics, Circuits and Systems, Date of Conference: Dec. 10-13, 2006, INSPEC Accession No. 9718569, Date Added to IEE Xplore: Jul. 2, 2007, Publisher: IEEE, Conference Location: Nice, France, pp. 668-671.

(Continued)

*Primary Examiner* — Kenneth B Wells
(74) *Attorney, Agent, or Firm* — Myers Bigel, P.A.

(57) ABSTRACT

The present disclosure relates to a circuit for level shifting of a data voltage from a transmitter. The circuit comprises an inverter logic. The inverter logic comprises a first transistor and a second transistor. The first transistor is connected to a source voltage and the second transistor is connected to ground. A capacitor is connected to an input of the first transistor and configured to drive the first transistor. The capacitor is configured to charge to a charged voltage equivalent to a difference between the source voltage and the data voltage. The second transistor is configured to be driven by the data voltage, thereby level shifting a level of the data voltage to a level of the source voltage.

20 Claims, 6 Drawing Sheets

(56) References Cited

U.S. PATENT DOCUMENTS

| | | | |
|---|---|---|---|
| 7,880,526 B2 * | 2/2011 | Acharya | H03K 3/356113 |
| | | | 327/333 |
| 9,270,275 B2 | 2/2016 | Song | |
| 9,331,679 B1 * | 5/2016 | Jain | H03K 19/018521 |
| 9,577,616 B2 | 2/2017 | Moore et al. | |
| 10,164,616 B2 * | 12/2018 | Huang | H03K 19/018521 |
| 10,348,304 B2 | 7/2019 | Ullmann et al. | |
| 2002/0153936 A1 | 10/2002 | Zerbe | |
| 2007/0170465 A1 * | 7/2007 | Kwon | H03K 19/018521 |
| | | | 257/197 |
| 2017/0149435 A1 | 5/2017 | Song | |

OTHER PUBLICATIONS

Hosseini et al., "A High Speed and Power Efficient Voltage Level Shifter for Dual Supply Applications", Published in IEEE Transactions on Very Large Scale Integration (VLSI) Systems, vol. 25, Issue: 3, Mar. 2017, Date of Publication: Sep. 21, 2016, INSPEC Accession No. 16691020, Publisher: IEEE, pp. 1154-1158.

Maghsoudloo et al., "A High-Speed and Ultra Low-Power Sub-threshold Signal Level Shifter", Published in: IEEE Transactions on Cicuits and Systems I: Regular Papers, vol. 64, Issue: 5, May 2017, Date of Publication: Dec. 20, 2016, INSPEC Accession No. 16823932, Publisher: IEEE, pp. 1164-1172.

* cited by examiner

CIRCUITS FOR LEVEL SHIFTING OF VOLTAGE OF DATA IN TRANSMITTING APPARATUS, AND METHODS THEREOF

CROSS-REFERENCE TO RELATED APPLICATION

This U.S. non-provisional patent application claims priority under 35 U.S.C. § 119 to and the benefit of Indian Patent Application No. 202041053874, filed on Dec. 11, 2020, the entire content of which is incorporated herein by reference.

TECHNICAL FIELD

The present disclosure relates in general to transmitting apparatuses for serial interface applications, and more particularly to circuits and methods for level shifting of voltage of data in a transmitting apparatus.

BACKGROUND

High-speed transmitting apparatuses are used in serial interface applications for converting parallel data to serial data. A typical transmitting apparatus comprises a serializer, a pre-driver circuit and a driver circuit. The driver circuit is connected to transmitting lanes for transmitting the serial data to a receiver, which is connected to further processing circuits. The serializer in the high-speed transmitting apparatus is implemented in a digital domain. The driver circuit used in the high-speed transmitting apparatus is implemented in an analog domain. The digital supply voltage is generally less than the analog supply voltage. The analog supply voltage used by the driver circuit is greater than the digital supply voltage so that the serial data is interpreted correctly by the receiver. Hence, a voltage of high-speed data from the serializer may be level shifted before feeding to the driver circuit.

Traditional level shifter circuits for level shifting the voltage of the high-speed data use cascoded transistors that shift a voltage (VDD) (digital supply voltage) to a voltage (2VDD) (analog supply voltage). Generally, a Positive-channel Metal Oxide Semiconductor (PMOS) transistor is used as a pull-up transistor and a Negative-channel Metal Oxide Semiconductor (NMOS) transistor is used as a pull-down transistor for level shifting the data voltage. In the traditional level shifter circuits, a continuous stream of serialized data is provided as input to the level shifting circuits. A drawback of the traditional level shifting circuits is Data Dependent Jitter (DDJ), i.e., when random data is driven as input, the traditional level shifting circuits add jitter since a tripping point of the traditional level shifter circuits may not be equal to half of the data voltage (VDD).

The information disclosed in this background of the disclosure section is only for enhancement of understanding of the general background of the invention and should not be taken as an acknowledgement or any form of suggestion that this information forms the prior art already known to a person skilled in the art.

SUMMARY

In an embodiment, the present disclosure discloses a circuit for level shifting a data voltage from a transmitter. The circuit comprises an inverter logic. The inverter logic comprises a first transistor and a second transistor. The first transistor is connected to a source voltage and the second transistor is connected to ground. A capacitor is connected to an input of the first transistor and configured to drive the first transistor. The capacitor is configured to charge to a charged voltage equivalent to a difference between the source voltage and the data voltage. The second transistor is configured to be driven by the data voltage, thereby level shifting a level of the data voltage to a level of the source voltage.

In an embodiment, the present disclosure discloses a method for level shifting a data voltage from a transmitter using a circuit. The circuit comprises an inverter logic comprising a first transistor and a second transistor; and at least one capacitor. The method comprises charging the at least one capacitor that is connected to an input of the first transistor to a charged voltage that is equivalent to a difference between a source voltage and the data voltage to drive the first transistor. The first transistor is connected to the source voltage and the second transistor is connected to ground. Further, the method comprises driving the second transistor using the data voltage, thereby level shifting a level of the data voltage to a level of the source voltage.

In an embodiment, the present disclosure discloses a circuit comprising a first transistor electrically connected to a source voltage, a second transistor electrically connected to ground, a data voltage electrically connected to an input of the second transistor, and at least one capacitor electrically connected to an input of the first transistor and to the input of the second transistor, wherein the at least one capacitor is configured to charge to a charged voltage equivalent to a difference between the source voltage and the data voltage. The first transistor and the second transistor are configured to shift a peak level of the data voltage to a level of the source voltage.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The novel features and characteristic of the disclosure are set forth in the appended claims. The disclosure itself, however, as well as a preferred mode of use, further objectives and advantages thereof, will best be understood by reference to the following detailed description of illustrative embodiments when read in conjunction with the accompanying figures. One or more embodiments are now described, by way of example only, with reference to the accompanying figures wherein like reference numerals represent like elements and in which:

Figure 1:
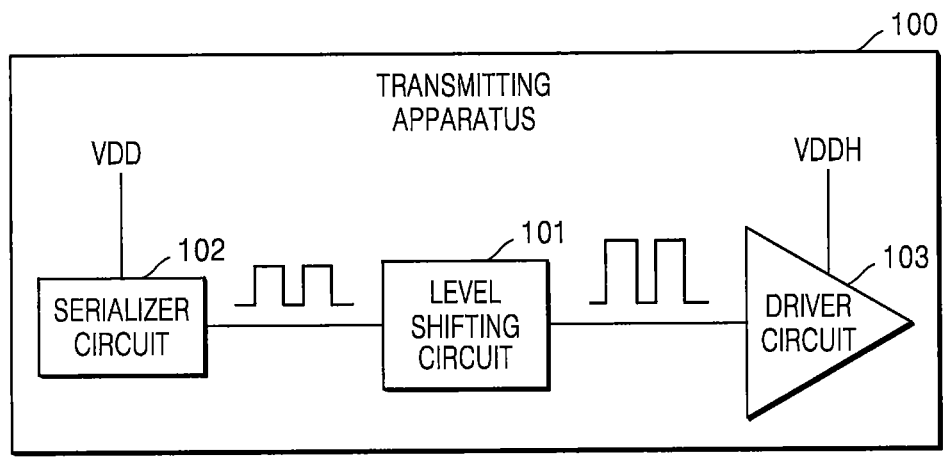
FIG. 1 shows an overview of a transmitting apparatus, in accordance with an embodiment of the present disclosure.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and executed by a computer or processor, whether or not such computer or processor is explicitly shown.

DETAILED DESCRIPTION

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiments thereof have been shown by way of example in the drawings and will be described in detail below. It should be understood, however that the illustrated embodiments are not intended to limit the disclosure to the particular forms disclosed, but on the contrary, the disclosure is to cover all modifications, equivalents, and alternatives falling within the scope of the disclosure.

The terms "comprises," "comprising," or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises" does not, without more constraints, preclude the existence of other elements or additional elements in the system or apparatus.

Embodiments of the present disclosure relates to circuits for level shifting of a voltage (VDD) of data in a transmitting apparatus. The voltage (VDD) of the data from a serializer may be level shifted prior to feeding the data to a driver circuit associated with the transmitter. In an embodiment, the driver circuit is a part of the transmitting apparatus. In another embodiment, the driver circuit is outside the transmitting apparatus. The circuit comprises an inverter logic comprising a first transistor and a second transistor. The first transistor is connected to a source having a source voltage (VDDH) and the second transistor is connected to a ground (e.g., GND). For the level shifting of the digital voltage (e.g., the data voltage), it is expected that the first transistor is in an OFF state (e.g., non-conducting) when the voltage of the data is VDD and is in an ON state (e.g., conducting) when the voltage of the data is ground (e.g., 0). However, in some conventional systems the first transistor may not detect the input data voltage (VDD) due to voltage variations. To solve this problem, at least one capacitor may be placed at an input of the first transistor to drive the first transistor. As used herein, "driving" a transistor may refer to providing a voltage and/or current at a control terminal of the transistor (e.g., the gate) to control the operation of the transistor. The at least one capacitor charges to a voltage equivalent to a difference between the source voltage (VDDH) and the data voltage (VDD) to drive the first transistor. The data voltage (VDD) is used to drive the second transistor, thereby level shifting the data voltage (VDD) to the source voltage (VDDH). Hence, the at least one capacitor is used to drive the first transistor for level shifting the voltage of the data.

FIG. 1 shows an exemplary implementation of a level shifting circuit (101) for level shifting of a voltage of data in a transmitting apparatus (100), in accordance with an embodiment of the present disclosure. In the present description, the circuit (101) is also referred to as the level shifting circuit (101). In an embodiment, the transmitting apparatus (100) is a serializer de-serializer (SERDES) transmitter. The transmitting apparatus (100) may follow serial interface standards including but not limited to High-Definition Multimedia Interface (HDMI), Display Port (DP), type-C or any other standards including multi-lane high speed serial to parallel conversion. The transmitting apparatus (100) comprises a serializer circuit (102), the level shifting circuit (101), and a driver circuit (103). The serializer circuit (102) receives a number of parallel data bits from a digital domain, serializes the parallel data bits, and transmits the serial data to a receiver (not shown in FIG. 1). The level shifting circuit (101) may be used for level shifting of voltage (VDD) of the data from the serializer circuit (102). The driver circuit (103) may utilize a voltage of the data that is more than half of a source voltage (VDDH) (e.g., a supply voltage). For instance, when the source voltage is 2V the driver circuit (103) may utilize a voltage of the data that is greater than 1V. In an embodiment, the nominal voltage required by the driver circuit (103) is 1.2V, however, the nominal voltage can be different for different types and applications of the transmitting apparatus (100). The digital voltage (VDD) of the data may be 0.7V. Hence, the voltage (VDD) of the data from the serializer circuit (102) i.e., 0.7V may be level shifted to a voltage (VDDH) e.g., 1.2V. The level shifting circuit (101) may be used for level shifting of the voltage (VDD) of the data to the voltage (VDDH). Input to the level shifting circuit (101) may be 0.7 V and output of the level shifting circuit (101) may be 1.2V. The data with the voltage 1.2V may be fed to the driver circuit (103). The driver circuit (103) transmits the level shifted data over transmitting lanes to the receiver. The voltage values described herein are merely examples and are not intended to limit the present disclosure.

Figure 2:
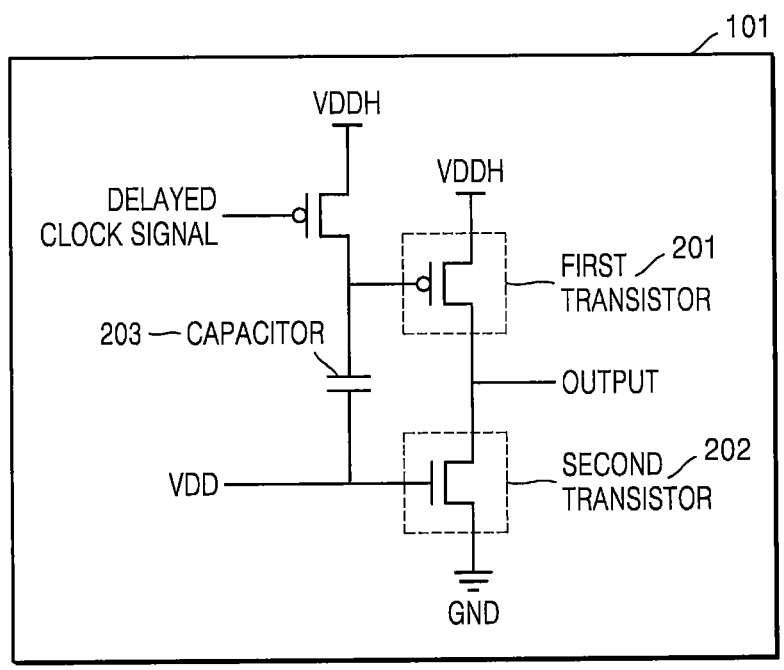
FIG. 2 shows an exemplary circuit for level shifting of the voltage of the data in the transmitting apparatus, in accordance with an embodiment of the present disclosure.

FIG. 2 shows an exemplary level shifting circuit (101) for level shifting of the voltage (VDD) of the data in the transmitting apparatus (100), in accordance with an embodiment of the present disclosure. The level shifting circuit (101) comprises a first transistor (201), a second transistor (202) and at least one capacitor (203). The first transistor (201) may be connected to a source having the source voltage (VDDH) and the second transistor (202) may be connected to a ground. The at least one capacitor (203) may be placed at an input of the first transistor (201). In an embodiment, a positive plate of the at least one capacitor (203) is connected to the first transistor (201) and a negative plate of the at least one capacitor (203) is connected to the second transistor (202). Therefore, when the at least one capacitor (203) is charged, the charges are provided to the first transistor (201). In an embodiment, the first transistor (201) may be a Positive-channel Metal Oxide Semiconductor (PMOS) transistor (201) and the second transistor (202) may be a Negative-channel Metal Oxide Semiconductor (NMOS) transistor (202). The PMOS transistor (201) may be used as a pull-up circuit connected to the source voltage (VDDH). The NMOS transistor (202) may be used as a pull-down transistor connected to ground. The PMOS transistor (201) and the NMOS transistor (202) may operate in definite states for level shifting the voltage (VDD) of the data. In the present description, the voltage (VDD) of the data is also referred to as data voltage (VDD). It is expected that the data voltage (VDD) drives the PMOS transistor (201) and the NMOS transistor (202).

A state of the NMOS transistor (202) is definite. The NMOS transistor (202) is in an OFF state when the data voltage (VDD) is 0 and the NMOS transistor (202) is in an ON state when the data voltage (VDD) has a peak value (for example, 0.7V). A state of the PMOS transistor (201) is indefinite. The PMOS transistor (201) is in an ON state when the data voltage (VDD) is 0. However, the state of the PMOS transistor (201) is indefinite when the data voltage has a peak value. A threshold voltage for the PMOS transistor (201) to be in an ON state is in the order of 0.2V to 0.4V. Generally, in real-world scenario, the data voltage provided to the PMOS transistor (201) varies by ±0.2V. Similarly, the source voltage (VDDH) also varies by ±0.2V. Hence, the PMOS transistor (201) may be in the ON state when the data voltage (VDD) is in the peak value (0.7V). Voltage variations may be due to the data voltage (VDD), voltage (VDDH) generator variations, non-zero resistance in supply wires or self-inductance of a supply line. Hence, the PMOS transistor (201) may be in the ON state for the data voltage (VDD) of 0.7V.

The at least one capacitor (203) is used to drive the PMOS transistor (201) to be in the OFF state when the data voltage (VDD) is at the peak value. The at least one capacitor (203) charges to a voltage equivalent to a difference between the source voltage (VDDH) and the data voltage (VDD). For example, when the source voltage (VDDH) is 1.2V and when the data voltage (VDD) is 0.7V, the at least one capacitor (203) is charged to a voltage 1.2-0.7=0.5V. The data voltage (0.7V) and the charged voltage of 0.5V is provided together to the PMOS transistor (201), i.e., 0.7V+ 0.5V=1.2V is provided to the PMOS transistor (201). The voltage of 1.2V drives the PMOS transistor (201) to be in the OFF state when the data voltage is 0.7V. Further, the state of the NMOS is definite, as the threshold of the NMOS transistor (202) is met by the data voltage (VDD). The output of the level shifting circuit (101) is the source voltage (VDDH).

Figure 3:
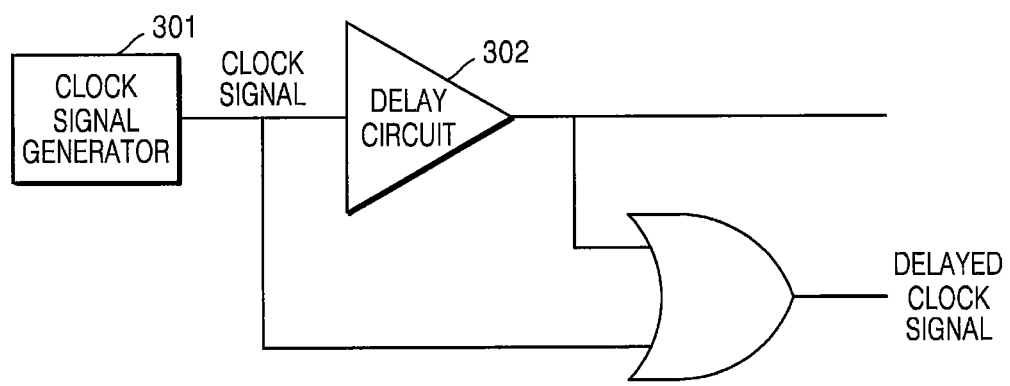
FIG. 3 shows an exemplary logic diagram for generating a delayed clock signal, in accordance with an embodiment of the present disclosure.

A delayed clock signal may be used for level shifting of the data voltage (VDD). FIG. 3 shows generation of the delayed clock signal. A clock signal generator (301) may be used to generate a high-speed clock signal. In an embodiment, the clock signal generator (301) may be a part of the level shifting circuit (101). In another embodiment, the clock signal generator (301) may be a main clock generator of the transmitting apparatus (100). A delay circuit (302) may be used to delay the generated clock signal. The delay circuit (302) may be a buffer. An OR gate may be used to create additional delay. The data voltage (VDD) is level shifted synchronously with the delayed clock signal. Generally, at state transitions (ON state to OFF state or vice versa) of the data voltage (VDD), i.e., at a rising edge or a falling edge, due to the 0.7V±0.2V, the DDJ occurs. Hence, when the delayed clock signal which has higher voltage is used, it enables switching of the transistors (201, 202) at edges of the delayed clock signal instead of edges of the data voltage (VDD). This reduces the DDJ.

Figure 4:
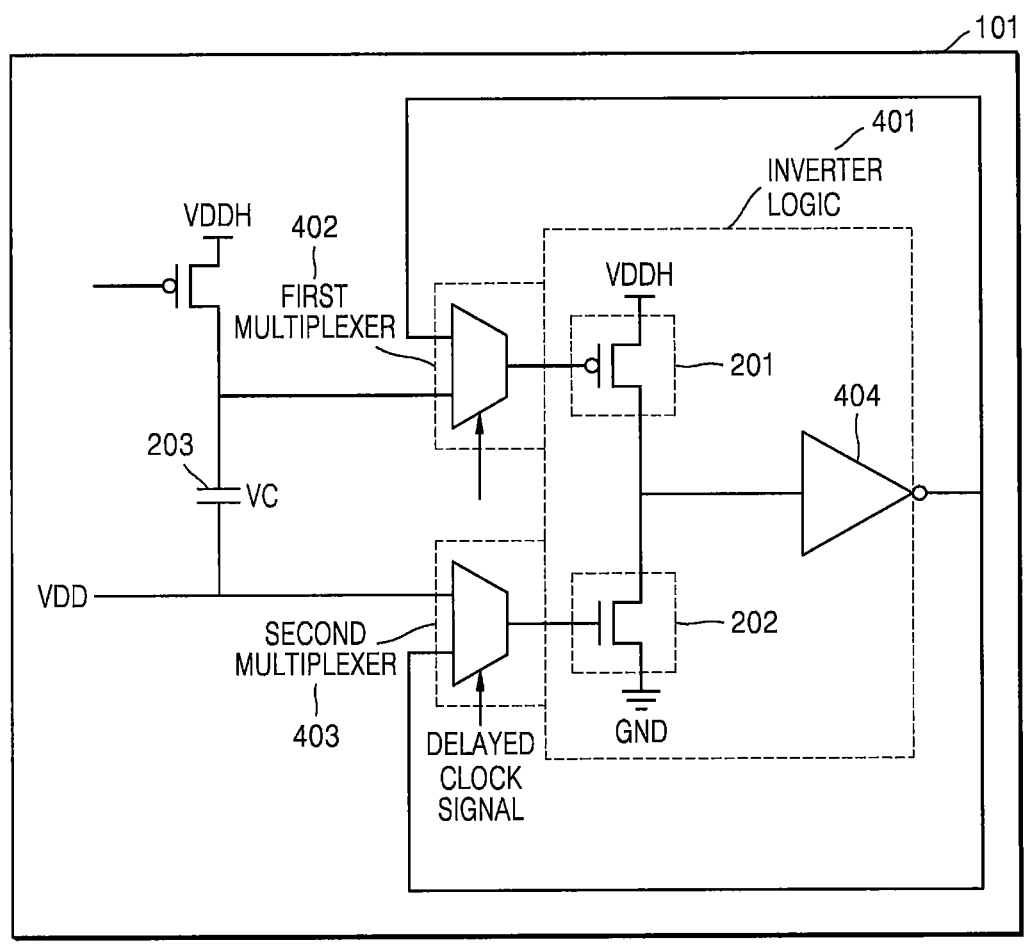
FIG. 4 shows a detailed circuit for level shifting of the voltage of the data in the transmitting apparatus, in accordance with an embodiment of the present disclosure.

FIG. 4 shows the detailed level shifting circuit (101) for level shifting of the data voltage (VDD) in the transmitting apparatus (100). The level shifting circuit (101) comprises the at least one capacitor (203), a first multiplexer (402), a second multiplexer (403), an inverter logic (401).

The inverter logic (401) comprises the first transistor (201) and the second transistor (202). The inverter logic (401) may be a Complementary Metal-Oxide Semiconductor (CMOS) inverter logic. The state of first transistor (201) may be indefinite when the data voltage (VDD) is at the peak value. Hence, the at least one capacitor (203) is used to provide an input voltage sufficient enough to drive the first transistor (201) to the OFF state. In an embodiment, the at least one capacitor (203) value may be based on the source voltage (VDDH) of the PMOS transistor (201) and the data voltage (VDD). In an embodiment, the at least one capacitor (203) is configured to store charges equivalent to a difference between the source voltage (VDDH) and the data voltage (VDD). Therefore, the data voltage (VDD) along with the stored voltage (referred to as Vc and/or charged voltage hereafter in the present disclosure) drives the PMOS transistor (201) to the OFF state when the data voltage (VDD) has the peak value. Since the state of the second transistor (202) is definite, the data voltage (VDD) is used to drive the second transistor (202).

The first multiplexer (402) and the second multiplexer (403) may be 2:1 multiplexers. The first multiplexer (402) may connect the at least one capacitor (203) to the first transistor (201). The data voltage (VDD) along with the charged voltage (Vc) may be provided as a first input to the first multiplexer (402). An inverted feedback may be provided as a second input to the first multiplexer (402). In an embodiment, the inverted feedback is obtained from an output of the inverter logic (401). The second multiplexer (403) may connect the at least one capacitor (203) to the second transistor (202). The data voltage (VDD) may be provided as a first input to the second multiplexer (403). The inverted feedback may be provided as a second input to the second multiplexer (403). A selection signal for the first multiplexer (402) and the second multiplexer (403) may be the delayed clock signal. Based on the selection signal, the first multiplexer (402) and the second multiplexer (403) selects the first input or the second input respectively.

In a first half cycle of the delayed clock signal, the PMOS transistor (201) receives the voltage (VDD+Vc) and NMOS transistor (202) receives the data voltage (VDD) via the first multiplexer (402) and the second multiplexer (403) respectively, which drives the transistors (201, 202) to level shift the data voltage (VDD) to the source voltage (VDDH). In a second half cycle of the delayed clock signal, the respective multiplexers (402, 403) relay the inverted output to both the transistors (201, 202). Therefore, even in the second half cycle of the delayed clock signal, the first half cycle's output is held. Therefore, the state transition of the data voltage (VDD) is passed and, at the next first half cycle of a second clock cycle, the voltage (VDD+Vc) is given to the PMOS transistor (201) and the data voltage (VDD) to the NMOS transistor (202) and the cycle repeats all over. The PMOS transistor (201) is driven based on the clock signal unlike conventional techniques of being driven based on the data voltage (VDD) which would result in the DDJ.

The first transistor (201) and the second transistor (202) make a first inverter. The inverter logic (401) comprises a second inverter (404). When an output of the first inverter is provided as a feedback to itself, the output of the first inverter keeps toggling. The first inverter would theoretically oscillate with an infinitely high frequency. In order to maintain the logic, the second inverter (404) is used and the output of the second inverter (404) is provided as the feedback to the first inverter. Also, the output of the first inverter will be an inverted level shifted signal. Hence, the inverted level shifted signal is passed through the second inverter (404) to obtain a non-inverted level shifted signal.

The non-inverted level shifted signal is transmitted over the transmitting lanes to the receiver.

Figure 5:
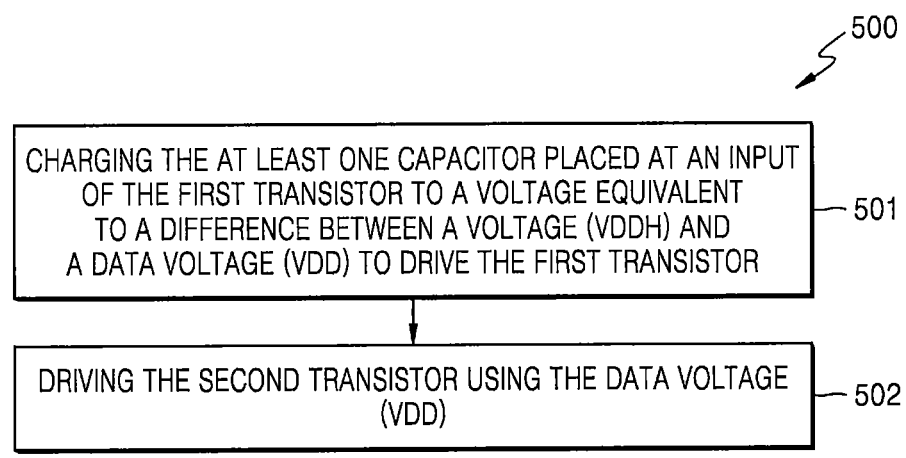
FIG. 5 shows a flowchart illustrating method steps for level shifting of the voltage of the data in the transmitting apparatus, in accordance with an embodiment of the present disclosure.

FIG. 5 shows a flowchart illustrating method steps for level shifting of the voltage (VDD) of the data in the transmitting apparatus (100), in accordance with an embodiment of the present disclosure.

As illustrated in FIG. 5, the method (500) may comprise one or more steps. The method (500) may be described in the general context of computer executable instructions. Generally, computer executable instructions can include routines, programs, objects, components, data structures, procedures, modules, and functions, which perform particular functions or implement particular abstract data types.

The order in which the method (500) is described is not intended to be construed as a limitation, and any number of the described method blocks can be combined in any order to implement the method. Additionally, individual blocks may be deleted from the methods without departing from the scope of the subject matter described herein. Furthermore, the method can be implemented in any suitable hardware, software, firmware, or combination thereof.

At step (501), charging the at least one capacitor (203) placed at an input of the first transistor (201) to a voltage equivalent to a difference between the source voltage (VDDH) and the data voltage (VDD) to drive the first transistor (201). The at least one capacitor (203) may be used to drive the first transistor (201) in the first half cycle of the delayed clock signal. The first transistor (201) may not be in the OFF state in response to the data voltage (VDD). The at least one capacitor (203) may drive the first transistor (201) to be in the OFF state. The first multiplexer (402) may provide the data voltage (VDD) and the charged voltage (Vc) to the first transistor (201). This voltage may drive the first transistor (201) to be in the OFF state when the data voltage is having the peak value. Hence the second transistor (202) may pull the output to the voltage (0).

Step (502) includes driving the second transistor (202) using the data voltage (VDD), thereby level shifting the data voltage (VDD) to the source voltage (VDDH). The state of the second transistor (202) is definite. The second transistor (202) is in the OFF state when the data voltage (VDD) is 0 and is in the ON state when the data voltage (VDD) has the peak value (for example, 0.7V). The second multiplexer (403) may provide the data voltage (VDD) to the second transistor (202) in the first half cycle of the delayed clock signal. The data voltage (VDD) may drive the second transistor (202), and the data voltage (VDD) along with the charged voltage (Vc) may drive the first transistor (201), thereby level shifting the data voltage (VDD) to the source voltage (VDDH).

Figure 6:
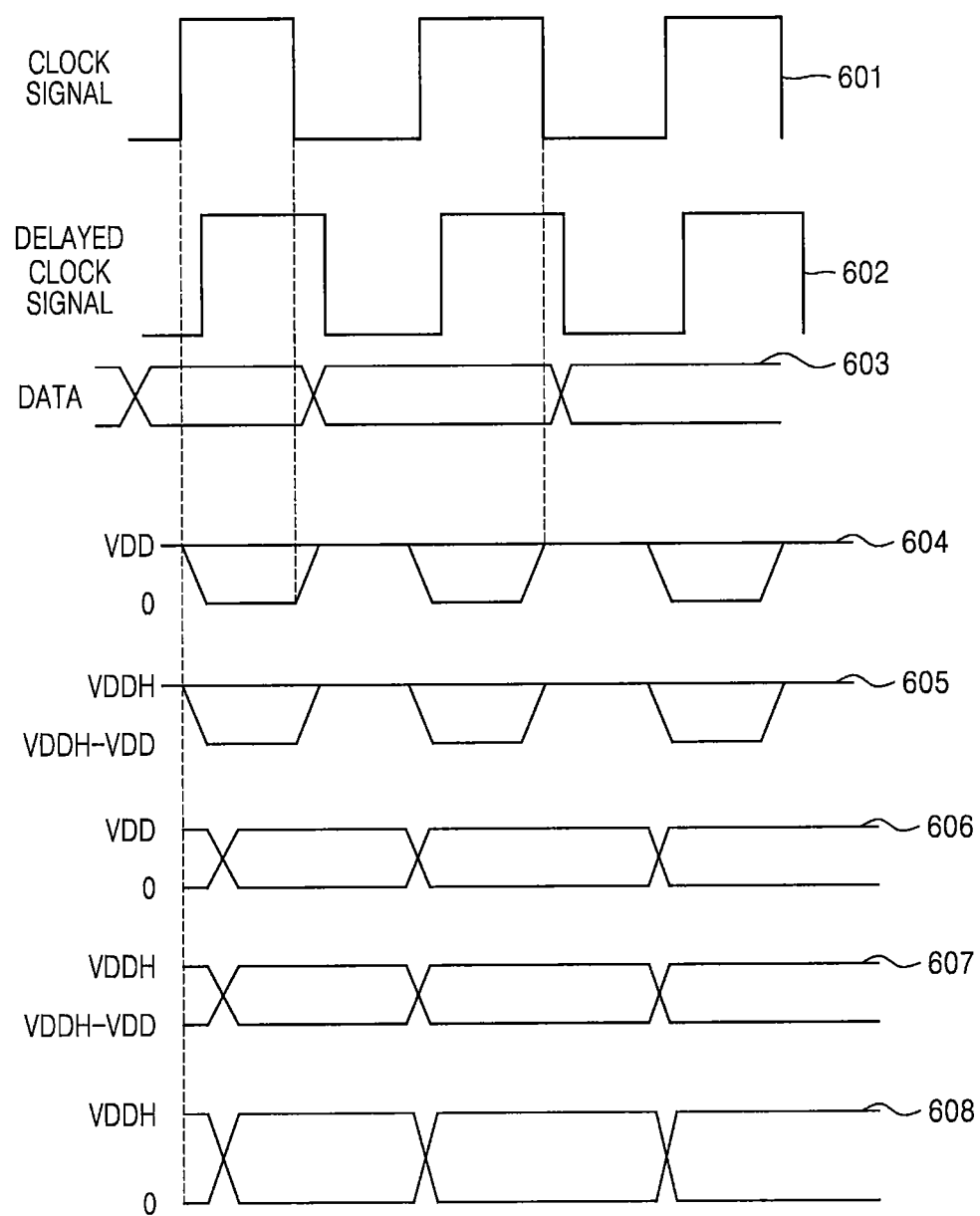
FIG. 6 illustrates waveforms for level shifting of the voltage of the data in the transmitting apparatus, in accordance with an embodiment of the present disclosure.

FIG. 6 illustrates waveforms for level shifting of the voltage (VDD) of the data in the transmitting apparatus (100). The waveform (601) is the clock signal generated by the clock signal generator (301). In an embodiment, the clock signal is a high-speed signal A period of the clock signal may be 1000 ps. A first half cycle of the clock signal and a second half cycle of the clock signal may be 500 ps each. The waveform (602) shows the delayed clock signal generated by the delay circuit (302). The waveform (603) shows the data. The level shifting of the data voltage (VDD) is performed synchronously with the delayed clock signal. The waveform (604) shows the data voltage (VDD) provided by the at least one capacitor (203) as input to the second multiplexer (403). The data voltage (VDD) ranges from 0 to the peak value. As shown in (606), a voltage input of the second transistor (202) swings from 0 to VDD when the data voltage (VDD) ranges from 0 to the peak value. (605) shows the data voltage (VDD) along with the charged voltage (Vc) provided by the at least one capacitor (203) to the first multiplexer (402). As shown in (607), a voltage input of the first transistor (201) swings/ranges from a difference between the source voltage and the data voltage (VDDH-VDD) to the source voltage (VDDH) when the data voltage (VDD) ranges from 0 to the peak value. (608) shows the level shifted voltage from the level shifting circuit (101) with the source voltage (VDDH). As seen from the waveform (608), the data voltage is level shifted from VDD to VDDH. Thus, the data voltage is represented with a higher voltage to be transmitted over the transmitting lanes, while reducing jitter in the transmitting apparatus (100).

The present disclosure uses a capacitor to drive a first transistor, since the first transistor cannot be driven to an OFF state for the data voltage (VDD). The present disclosure uses the delayed clock signal for performing the level shifting of a voltage (VDD) of the data. Hence, when the delayed clock signal which has higher voltage is used, it enables switching the transistors (201, 202) at edges of the delayed clock signal instead of edges of the data voltage (VDD). This reduces the DDJ. Table 1 shows the advantages of the present disclosure in comparison with the traditional techniques.

TABLE 1

| Comparison Point | Traditional techniques | Present disclosure |
| --- | --- | --- |
| Power | 2 mA | 300 uA |
| Jitter (DDJ) | >10 ps | ~1 ps |
| Supply Noise Rejection | ~5 ps | ~2 ps |
| Propagation Delay | ~80 ps | ~40 ps |

The terms "an embodiment," "embodiment," "embodiments," "the embodiment," "the embodiments," "one or more embodiments," "some embodiments," and "one embodiment" mean "one or more (but not necessarily all) embodiments of the invention(s)" unless expressly specified otherwise.

The terms "including," "comprising," "having," and variations thereof mean "including but not limited to," unless expressly specified otherwise.

The enumerated listing of items does not imply that any or all of the items are mutually exclusive, unless expressly specified otherwise. The terms "a," "an," and "the" mean "one or more," unless expressly specified otherwise.

A description of an embodiment with several components in communication with each other does not imply that all such components are required. On the contrary a variety of optional components are described to illustrate the wide variety of possible embodiments of the invention.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

The illustrated operations of FIG. 5 show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

| Referral Numerals: | |
|---|---|
| Referral Number | Description |
| 100 | Transmitting apparatus |
| 101 | Circuit |
| 102 | Serializer circuit |
| 103 | Driver circuit |
| 201 | First transistor |
| 202 | Second transistor |
| 203 | Capacitor |
| 301 | Clock signal generator |
| 302 | Delay circuit |
| 401 | Inverter logic |
| 402 | First multiplexer |
| 403 | Second multiplexer |

We claim:

1. A circuit for level shifting of a data voltage from a transmitter, the circuit comprising:
   a clock signal generator configured to generate a clock signal and a delayed clock signal;
   an inverter logic comprising a first transistor and a second transistor, wherein the first transistor is connected to a source voltage and the second transistor is connected to ground; and
   at least one capacitor connected to an input of the first transistor and configured to drive the first transistor, wherein the at least one capacitor is configured to charge to a charged voltage equivalent to a difference between the source voltage and the data voltage,
   wherein the second transistor is configured to be driven by the data voltage, thereby level shifting a level of the data voltage to a level of the source voltage.

2. The circuit as claimed in claim 1, wherein the delayed clock signal is generated by passing the clock signal though a delay circuit.

3. The circuit as claimed in claim 1, further comprising:
   a first multiplexer connecting the at least one capacitor to the first transistor, wherein the data voltage along with the charged voltage is provided as a first input to the first multiplexer to drive the first transistor in a first half cycle of a delayed clock signal, and wherein an inverted feedback is provided as a second input to the first multiplexer to drive the first transistor in a second half cycle of the delayed clock signal, wherein the inverted feedback is obtained from an output of the inverter logic; and
   a second multiplexer connecting the at least one capacitor to the second transistor, wherein the data voltage is provided as a first input to the second multiplexer to drive the second transistor in the first half cycle of the delayed clock signal, and wherein the inverted feedback is provided as a second input to the second multiplexer to drive the second transistor in the second half cycle of the delayed clock signal.

4. The circuit as claimed in claim 1,
   wherein the first transistor is configured to be driven by the charged voltage of the at least one capacitor and the second transistor is configured to be driven by the data voltage to level shift the level of the data voltage to the level of the source voltage in a first half cycle of the delayed clock signal,
   wherein the first transistor and the second transistor are configured to be driven by an inverted feedback from an output of the inverter logic in a second half cycle of the delayed clock signal.

5. The circuit as claimed in claim 1, wherein the inverter logic is a Complementary Metal-Oxide Semiconductor (CMOS) inverter logic.

6. The circuit as claimed in claim 1, wherein the at least one capacitor is connected between the source voltage and the data voltage.

7. The circuit as claimed in claim 1, wherein a voltage input of the first transistor ranges from a difference between the source voltage and the data voltage to the source voltage when the data voltage ranges from 0 to a peak value, and a voltage input of the second transistor ranges from 0 to the data voltage when the data voltage ranges from 0 to the peak value.

8. The circuit as claimed in claim 7, wherein the first transistor is configured to be in an ON state and the second transistor is configured to be in an OFF state in response to the data voltage being 0, and
   wherein the first transistor is configured to be in the OFF state and the second transistor is configured to be in the ON state, in response to the data voltage having the peak value.

9. The circuit as claimed in claim 1, wherein the circuit is configured to shift a peak level of the data voltage synchronously with edges of the delayed clock signal that are separated in time from transitions of the data voltage.

10. A method for level shifting a data voltage from a transmitter using a circuit, the circuit comprising: an inverter logic comprising a first transistor and a second transistor; and at least one capacitor, the method comprising:
    charging the at least one capacitor that is connected to an input of the first transistor to a charged voltage that is equivalent to a difference between a source voltage and the data voltage to drive the first transistor, wherein the first transistor is connected to the source voltage and the second transistor is connected to ground; and
    driving the second transistor using the data voltage, thereby level shifting a level of the data voltage to a level of the source voltage,
    wherein the charged voltage of the at least one capacitor drives the first transistor, and the data voltage drives the second transistor, to level shift the level of the data voltage to the level of the source voltage in a first half cycle of a delayed clock signal, and
    wherein an inverted feedback from an output of the inverter logic drives the first transistor and the second transistor in a second half cycle of the delayed clock signal.

11. The method as claimed in claim 10, wherein a clock signal and the delayed clock signal are generated using a clock signal generator.

12. The method as claimed in claim 11, wherein the delayed clock signal is generated by passing the clock signal though a delay circuit.

13. The method as claimed in claim 10, further comprising:
providing the data voltage along with the charged voltage as a first input to a first multiplexer to drive the first transistor in the first half cycle of the delayed clock signal;
providing the inverted feedback as a second input to the first multiplexer to drive the first transistor in the second half cycle of the delayed clock signal;
providing the data voltage as a first input to a second multiplexer to drive the second transistor in the first half cycle of the delayed clock signal; and
providing the inverted feedback as a second input to the second multiplexer to drive the second transistor in the second half cycle of the delayed clock signal.

14. The method as claimed in claim 10, wherein a voltage input of the first transistor ranges from a difference between the source voltage and the data voltage to the source voltage when the data voltage ranges from 0 to a peak value, and a voltage input of the second transistor ranges from 0 to the data voltage when the data voltage ranges from 0 to the peak value.

15. The method as claimed in claim 10,
wherein the first transistor is configured to be in an ON state and the second transistor is configured to be in an OFF state, in response to the data voltage being 0, and
wherein the first transistor is configured to be in the OFF state and the second transistor is configured to be in the ON state, in response to the data voltage having a peak value.

16. The method as claimed in claim 10, further comprising:
shifting a peak level of the data voltage synchronously with edges of the delayed clock signal that are separated in time from transitions of the data voltage.

17. A circuit comprising:
a first transistor electrically connected to a source voltage;
a second transistor electrically connected to ground;
a data voltage electrically connected to an input of the second transistor;
at least one capacitor electrically connected to an input of the first transistor and to the input of the second transistor, wherein the at least one capacitor is configured to charge to a charged voltage equivalent to a difference between the source voltage and the data voltage;
a first multiplexer electrically connected between the at least one capacitor and the first transistor, the first multiplexer comprising a first input electrically connected to the at least one capacitor and a second input electrically connected to an output feedback signal; and
a second multiplexer electrically connected between the data voltage and the second transistor, the second multiplexer comprising a first input electrically connected to the data voltage and a second input electrically connected to the output feedback signal,
wherein the first transistor and the second transistor are configured to shift a peak level of the data voltage to a level of the source voltage.

18. The circuit as claimed in claim 17, wherein the first multiplexer is configured to select the first input of the first multiplexer during a first half cycle of a delayed clock signal and to select the second input of the first multiplexer during a second half cycle of the delayed clock signal, and
wherein the second multiplexer is configured to select the first input of the second multiplexer during the first half cycle of the delayed clock signal and to select the second input of the second multiplexer during the second half cycle of the delayed clock signal.

19. The circuit as claimed in claim 18, wherein the circuit is configured to shift the peak level of the data voltage synchronously with edges of the delayed clock signal that are separated in time from transitions of the data voltage.

20. The circuit as claimed in claim 17, the circuit further comprising an inverter logic that comprises the first transistor and the second transistor,
wherein the charged voltage of the at least one capacitor drives the first transistor, and the data voltage drives the second transistor, to level shift the level of the data voltage to the level of the source voltage in a first half cycle of a delayed clock signal, and
wherein an inverted feedback from an output of the inverter logic drives the first transistor and the second transistor in a second half cycle of the delayed clock signal.

* * * * *